United States Patent [19]
Marchetti et al.

[11] Patent Number: 5,277,996
[45] Date of Patent: Jan. 11, 1994

[54] FUEL CELL ELECTRODE AND METHOD FOR PRODUCING SAME

[76] Inventors: George A. Marchetti, 5726 Grand Ave., Wester Springs, Ill. 60558; William R. Loewe, 156 Nottingham, Bolingbrook, Ill. 60440

[21] Appl. No.: 907,969

[22] Filed: Jul. 2, 1992

[51] Int. Cl.$^5$ .................. H01M 4/99; H01M 4/96
[52] U.S. Cl. ............................ 429/44; 429/30
[58] Field of Search .................. 429/44, 30, 40, 12

[56] References Cited

PUBLICATIONS

Moore, Robert & Martin, Charles, "Procedure for Preparing Solution—Cast Perfluorosulfonate Ionomer Films and Membranes," 58 Analytical Chemistry 1986, pp. 2570–2571.
Weber, Michael et al. "Sputtered Fuel Cell Electrodes," 134 Journal of the Electrochemical Society 1987 pp. 1416–1419.
Dworetzy, Tom, "New Life for A Cell: The Ceramic Solution," Discover Jul. 1987, p. 16.
Srinivasan, Supramaniam et al., "Advances in Solid Polymer Electrolyte Fuel Cell Technology With Low Platinum Loading Electrodes," 22 Journal of Power Sources 1988, pp. 359–375.
Ticianelli, Edson, "Localization of Platinum in Low Catalyst Loading Electrodes to Attain High Power Densities in SPE Fuel Cells," 251 Journal of Electroanalytical Chemistry 1988 pp. 275–295.
Ticinelli, E. A. et al., "Methods to Advance Technology of Proton Exchange Membrane Fuel Cells," 135 Journal of the Electrochemical Society Sep. 1988, pp. 2209–2214.
Appleby, A. & Foulkes, F., Fuel Cell Handbook, 1989, Chpters. 1, pp. 3–7 Chptrs. 8 & 9.
Srinivasan, Supramaniam, "Fuel Cells for Extraterrestrial and Terrestrial Applications," 136 Journal of the Electrochemical Society Feb. 1989 pp. 41C–48C.
Kirschner, Elisabeth "Will the 21st Century Be Battery Operated?" Business Week Dec. 24, 1990 pp. 40–41.
Webb, Jeremy, "Hydrogen-Powered Electric Car Sets Sceptics Wondering," New Scientist, Jun. 29, 1991, p. 30.
Hubscher, Ralph "Fuel Cells," Radio-Electronics, Jun. 1991, pp. 61–64.
Poirier, D. M. et al., "Formation of Fullerides and Fullerene-Based Heterostructure," 253 Science, Aug. 9, 1991, pp. 646–648.
Edelson, Edward, "Buckyball the Magic Molecule," Popular Science, Aug. 1991 pp. 52–57, 87.
Curl, Robert & Smalley, Richard, "Fullerenes" Scientific American, Oct. 1991 pp. 54–63.

*Primary Examiner*—John S. Maples
*Attorney, Agent, or Firm*—Wayne L. Tang

[57] ABSTRACT

An improved fuel cell electrode and method for construction is disclosed wherein the electrodes are formed from adjacent layers of a porous substrate material such as carbon, and $C_{60}$ carbon molecules or fullerenes. The $C_{60}$ carbon molecules are arranged in face centered cubes and bind platinum atoms interspaced in the interstices of the cubes and on the $C_{60}$ molecules to form a $Pt/C_{60}$ layer. Lattices of platinum atoms are anchored to the individual platinum atoms of the $Pt/C_{60}$ molecular layer to form a catalyst layer only several molecules thick. The resulting platinum atoms of the catalyst layer have a much greater surface area in contact with the electrolyte due to the chaotic surface area of the catalyst layer. The platinum atoms of that layer act as a catalyst for the fuel cell reaction.

8 Claims, 3 Drawing Sheets

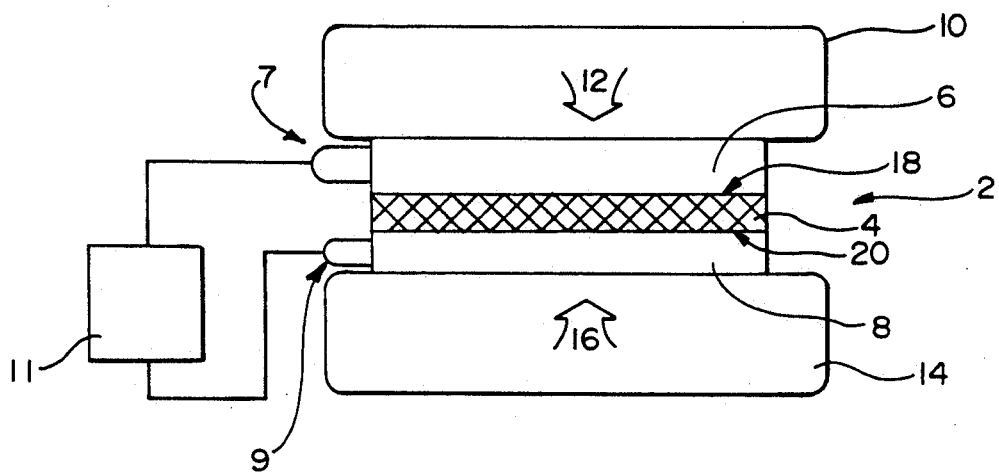
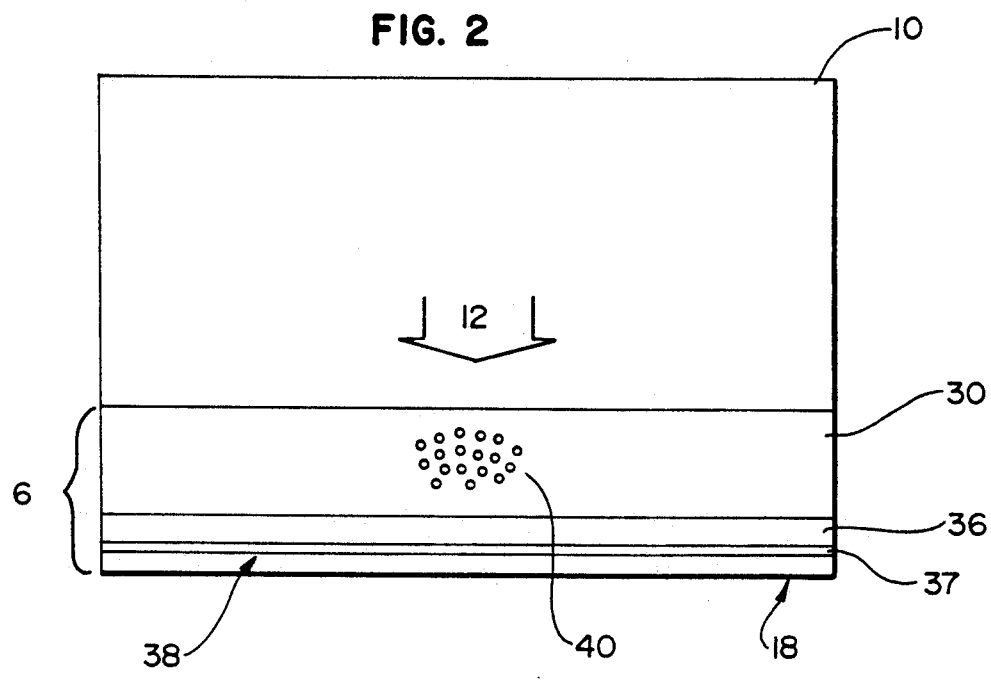

FUEL CELL ELECTRODE AND METHOD FOR PRODUCING SAME

BACKGROUND OF THE INVENTION

1. Field of the Invention

This invention relates to an improved fuel cell electrode and the method for manufacturing this electrode.

2. Background Art

Although the idea of generating electricity by the oxidation of gaseous fuel has existed for centuries, an inexpensive, commercially available fuel cell has been heretowith unobtainable. The advantages of fuel cells are well known. The cells are capable of generating large amounts of electricity directly from the reaction of the fuel and the oxidant. Furthermore, unlike conventional lead or alkaline batteries which require replacement of depleted electrode materials, there are no active materials in fuel cell electrodes, giving fuel cells a significantly increased lifetime. The cell only requires recharges of fuel and oxidant to continue operation. Finally, such cells are environmentally sound as they produce only heat, water and small amounts of carbon dioxide as byproducts. The advantages of fuel cells are such that NASA employs hydrogen fuel cells for primary electrical power on satellites and manned space missions. Numerous other applications may be envisioned. For example, inexpensive fuel cells could serve as on site electrical power generators for the power industry, as supplementary power sources for industry through co-generation, as field generators, and as a possible replacement for the internal combustion engine in vehicles.

A fuel cell consists of two chambers, one containing the fuel, usually hydrogen, and the second containing an oxidant, usually oxygen or an oxygen rich gas such as air. The hydrogen and oxidant chambers sandwich two electrodes which in turn surround an electrolyte. Hydrogen atoms are adsorbed at one electrode (the anode) to break the hydrogen molecular bonds, creating hydrogen ions and free electrons. These electrons, as will be discussed, flow from the anode to a load device, such as a light bulb, and flow on to the other electrode, the cathode. The hydrogen ions, migrating through the acidic electrolyte, react with the oxygen molecules at the cathode in a reduction reaction to produce water. The adsorption of the hydrogen molecules is stimulated by the use of a catalyst layer serving as the interface between each of the two electrodes and the electrolyte. The potential difference existing between the hydrogen and oxygen electrodes (anode and cathode, respectively) thus creates an electrical current. Once the electrons reach the cathode, they are consumed by the reduction reaction.

However, current fuel cell electrodes suffer from a number of shortcomings. First, the most efficient known catalyst of hydrogen is platinum, while the most cost effective electrode material is porous carbon. Unfortunately, platinum does not readily adhere to carbon. Thus, the platinum atoms which catalyze the reaction are susceptible to migration from the electrode. Therefore, like a conventional battery, current platinum-based electrodes tend to degrade in performance over time and must be replaced. Second, conventional platinum electrodes are extremely expensive. Due to its normally ordered lattice structure, pure platinum provides only a relatively small surface area of exposed platinum atoms with which to catalyze the oxidation reaction. As a result, in state of the art electrodes, almost 50 grams of platinum is used to produce each kilowatt of electricity. Finally, state of the art fuel cell electrodes which use a solid polymer electrolyte require pre-humidification of the reactant gases because water vapor tends to escape through the pores of the electrode. Loss of water from the solid polymer electrolyte reduces ionic conductivity and the overall cell reaction.

Recently, an exciting advance in the area of electronics and batteries has been the discovery of the $C_{60}$ molecule. Until the discovery of this molecule, carbon atoms had been thought to exist in only two molecular states; either in a pyramid shape as in diamond or in a hexagon shape as in graphite. This new carbon molecule contains 60 carbon atoms arranged roughly in a soccer ball shape, prompting the name "buckminster fullerene", "buckyball" or "fullerene." The carbon atoms of the fullerene molecule are bonded in a manner such that there are no dangling surface bonds on the molecule. This molecular configuration has unique properties allowing for ultra stable structures at both the atomic and molecular level, making it ideal for numerous applications. For example, the use of fullerenes for lubricants, semiconductors, and superconductors has been contemplated. Recently, electrical conductivity was found to be maximized by fullerene molecules doped with potassium in such a manner as to form a $K_3C_{60}$ compound. The fullerene salt thus created is a stable metallic crystal which is a completely three dimensional molecular metal formed by potassium atoms arranging themselves within the ordered pattern of fullerenes.

In the context of the present invention, the use of fullerenes in fuel cell electrodes is contemplated as the beneficial advance. Specifically, a fuel electrode must first facilitate the dissolution of gas molecules, then diffusion of the gas molecules to the electrolyte-electrode interface, and finally provide the largest possible area of a material with high electrocatalytic activity in contact with the electrolyte. The use of fullerenes in the composition of fuel cell electrodes will facilitate these functions. In addition, when a solid polymer electrolyte is used, pre-humidification of reactant gases should be unnecessary.

OBJECTS OF THE INVENTION

In view of the foregoing, it is an object of the invention to provide a fuel cell electrode which minimizes the use of platinum by creating greater catalytic contact with the electrolyte.

Another object is to provide a fuel cell electrode to prevent platinum migration and carbon oxidation within the electrode.

Still another object is to provide fuel cell electrodes which may be repeatedly reused.

Yet another object is to use $C_{60}$ fullerene molecules to bond heterogeneous materials together.

Yet another object is to provide a fuel cell electrode which, when used with a solid polymer electrolyte, requires no pre-humidification of reactant gases.

Still another object is to provide a fuel cell electrode which, when used in conjunction with a solid polymer electrolyte, minimizes the amount of electrode flooding which may occur.

SUMMARY OF THE INVENTION

The foregoing objects are met by an improved fuel cell electrode containing fullerene molecules coated with platinum for use in a fuel cell and a process for producing the same. The fuel cell has a chamber for fuel gas, an oxidant chamber, an electrolyte layer disposed between the fuel chamber and the oxidant chamber, and an anode and a cathode defined by two electrodes according to the present invention, respectively.

The electrodes are composed of substantially planar adjacent layers. These layers include a carbon substrate layer in physical contact with either the fuel chamber or the oxidant chamber, depending on whether the anode or cathode is being considered. The substrate layer is a porous carbon compound such as graphitized carbon. Next, an anchor layer, composed of $C_{60}$, where the carbon atoms are arranged in fullerene molecules which are further arranged in face centered cubes, is provided. Finally, a platinum layer serving as the catalyst of the reduction/oxidation reaction is attached to the anchor layer by means of lattice structured platinum atoms being bonded to at least one of the $C_{60}$ fullerene molecules.

The molecules of the fullerene layer hold clumps of lattice structure platinum atoms. The platinum atoms thus form an uneven and irregular surface in relation to the electrolyte layer, resulting in a greater amount of surface area and available contact area with the electrolyte. The increased contact area of the platinum catalyst atoms in turn increases the rate of production of hydrogen ions and oxygen atoms available for the reduction reaction producing water. In addition, the platinum atoms are firmly anchored in the interstices of the fullerene molecule lattices, making migration difficult. Finally, the use of fullerenes prevents the oxidation of carbon atoms since there are no loose surface bonds on the fullerenes in contact with non-crystalline bonded carbon atoms. By virtue of a slight positive pressure of the gaseous reactants, liquid will be retained in the electrolyte. Drying out of the electrolyte membrane and electrode flooding will thereby be prevented.

BRIEF DESCRIPTION OF THE DRAWINGS

The invention may be better understood from the following detailed description when read with reference to the drawings in which:

FIG. 1 shows the electrodes of the present invention installed in a hydrogen fuel cell;

FIG. 2 illustrates the layers of the electrode of the present invention;

DETAILED DESCRIPTION OF THE PREFERRED EMBODIMENTS

Figure 3:
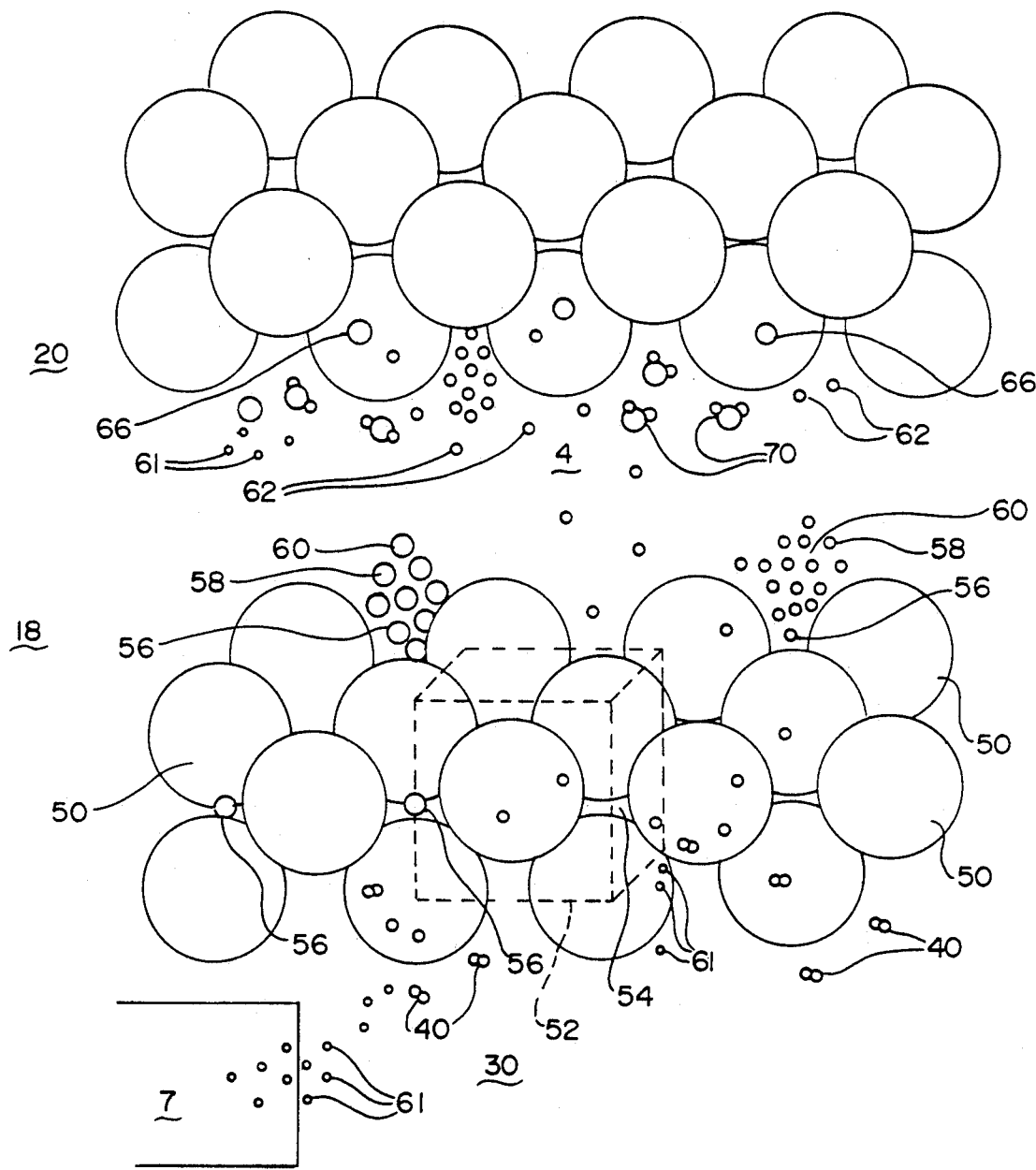
FIG. 3 represents the molecular bonding between the fullerene layer and the platinum catalyst layer.

The improved fuel cell electrodes according to the present invention are shown in a fuel cell 2 illustrated in FIG. 1. The fuel cell 2 is centered around an electrolyte matrix 4 which is preferably an acid electrolyte, such as TFMSA, TFMSA-MH, or phosphoric acid in a matrix such as silicon carbide or a solid polymer electrolyte. The electrolyte matrix 4 in the preferred embodiment is a solid polymer electrolyte manufactured by DuPont under the brand name Nafion ® with a thickness of 0.175 mm. The electrolyte matrix 4 is located between a pair of electrodes, anode 6 and cathode 8. An external electrical conductor 7 is connected to anode 6. A second external electrical conductor 9 is connected to cathode 8. The fuel cell 2 is activated when conductors 7 and 9 are connected to an electrical load 11 completing an electrical circuit. Electrical load 11 may be any electrical device, such as a light bulb or motor.

The anode 6 is placed between the electrolyte matrix 4 and the gas or fuel chamber 10 which contains fuel 12. In this embodiment, the fuel 12 is hydrogen gas, $H_2$. The interface between fuel chamber 10 and anode 6 allows the flow of fuel 12 to the anode 6. Cathode 8 is placed between the electrolyte matrix 4 and the oxidant chamber 14 in which oxidant 16 is stored. The interface between oxidant chamber 14 and cathode 8 allows the flow of oxidant 16 to cathode 8. In this embodiment the oxidant 16 is oxygen gas, $O_2$. Surface 18 of anode 6 in contact with electrolyte matrix 4 contains a catalyst material. This material is typically a metal and, in the preferred embodiment, the catalyst is platinum. Similarly, surface 20 of cathode 8 contacts electrolyte matrix 4 and also contains a platinum catalyst layer according to the preferred embodiment.

The operation of the fuel cell 2 is as follows. Hydrogen gas 12 from chamber 10 diffuses through anode 6 towards electrolyte matrix 4. As the hydrogen gas 12 is adsorbed, the bonds between the hydrogen atoms are broken by the oxidation reaction, producing hydrogen ions and free electrons. The hydrogen ions then diffuse through the electrolyte matrix 4 to interface 20 located proximate to cathode 8. The electrons preferentially flow from anode 6 to conductor 7 since the electrolyte material in electrolyte matrix 4 is an electronic insulator. The electrons thus flow towards cathode 8 by means of conductor 9, creating a current and generating a voltage to drive electric load 11. This voltage is equivalent to the potential difference between anode 6 and cathode 8. In the preferred embodiment this potential difference is approximately 0.7 volts. Voltage will vary with the current density. Of course, this voltage may be increased to any desired voltage by putting multiple fuel cells in series. The electrons move through conductor 9 and diffuse through cathode 8 where upon arrival they are recombined with the oxidant and the hydrogen ions. Simultaneously, oxidant 16 diffuses through cathode 8 to react with the hydrogen ions and arriving electrons in a reduction reaction to form water.

Electrodes 6 and 8 are similar. Anode 6, which is connected to conductor 7 according to the invention, is shown in FIG. 2. This figure is not drawn to scale in order to clearly illustrate surface 18, which is the interface to electrolyte matrix 4. The anode 6 has a substrate layer 30 which is in direct physical contact with the fuel chamber 10 and is permeable to the flow of hydrogen gas 12.

The substrate layer 30 is made of fibrous carbon material, preferentially a porous carbon fiber such as graphite. This constitutes a solid surface which is porous to the fuel and serves to filter and diffuse the gas molecules such as hydrogen molecules 40. These molecules are diffused through the substrate layer 30 by pressure from the hydrogen gas 12 in fuel chamber 10. This pressure also serves to prevent acid or other compounds from weeping into the anode 6 from electrolyte matrix 4.

Since oxygen molecules are significantly larger than hydrogen molecules, corresponding substrate layer 30 should be more porous for cathode 8. One alternative for insuring proper porosity for cathode 8 is to have small, tapered gas channels which are formed perpendicular to the plane of the electrode within substrate layer 30. These gas channels terminate just below the surface of the substrate layer 30 in contact with the fullerene layer and catalyst layer described below. Also, substrate layer 30 of anode 6 may also have tapered gas channels to facilitate gas flow. Of course other substrate materials which are more porous than graphite may be used for the substrate layer 30 of the cathode 8 if perforating the surface of the substrate exposed to the oxidant or fuel is undesirable.

The fullerene carbon layer 36, one of the principle aspects of the present invention, is located on the substrate layer 30. Layer 36 is composed of $C_{60}$ carbon molecules which have roughly spherical or soccer ball shapes and are commonly known as "buckyballs" or "fullerenes." The fullerenes may be sublimed onto the graphite or carbon of substrate layer 30 as described below.

The fullerene carbon layer 36 is then coated with platinum. The coating may be performed by a variety of methods as will be described below. The platinum coating on the fullerene carbon layer 36 forms a $Pt/C_{60}$ anchor layer 37. The $Pt/C_{60}$ compound has good electrical conductivity. It should be noted that fullerene layer 36 may be completely doped or coated with platinum atoms in the formation of the $Pt/C_{60}$ anchor layer 37. Anchor layer 37 locks the platinum atoms into place within the fullerene molecule lattice structure. The platinum atoms in anchor layer 37 serve as "anchors" for the platinum in a catalyst layer 38, which in turn is bonded to layer 37 by means of electron beam evaporation, sputtering, vapor deposition, or electroplating. Catalyst layer 38 is composed of individual lattice structures of platinum atoms bonded to the platinum atom anchors of anchor layer 37. The platinum atoms in catalyst layer 38 are exposed to the electrolyte matrix 4 and serve as catalysts for the oxidation of the hydrogen molecules 40. Fullerene carbon layer 36 and anchor layer 37 are approximately 200 angstroms thick. Catalyst layer 38 is approximately 450 angstroms thick. Thus, all three layers are only several molecule diameters thick, permitting rapid diffusion of hydrogen molecules 40 to electrolyte matrix 4. Different thicknesses of fullerenes or platinum may be utilized to optimize performance. Of course, since cathode 8 is identical to anode 6, rapid diffusion of oxygen is also facilitated in the same manner by the corresponding fullerene layer and anchor layer of cathode 8.

A molecular representation of anchor layer 37 and catalyst layer 38 is shown in FIG. 3. Fullerene molecules 50 form a base for the active surface 18 of anode 6 which contacts electrolyte matrix 4. The fullerenes 50 are arranged in basic face centered cubes 52, indicated by the dashed lines in FIG. 3, each having one fullerene molecule at each corner of the cube and one fullerene molecule on each face. The cubes have a variety of spaces or interstices 54 available between the fullerene molecules 50. The platinum atoms 56 are anchored on the face centered cubes of the fullerene molecules 50 and may be located in the interstices 54. The platinum atoms 56 are thus available for bonding to other platinum atoms 58 arranged in normal metal lattice structures 60 to form catalyst layer 38. The platinum lattice structures 60 in the present invention are separated from one another, as shown in FIG. 3, and form an irregular, asymmetrical surface. This arrangement thus significantly increases the total contact area between the platinum atoms 58 and the electrolyte matrix 4 as opposed to the substantially planar surface formed by the normal platinum lattice structures of prior fuel cells. Moreover, prior fuel cells have used teflon to bind the platinum catalyst to the electrode. Platinum is mixed with the teflon and applied to the surface of the electrode substrate. The teflonated electrode is then baked at high temperature to sinter the teflon. As the teflon sinters, portions of the platinum are exposed. The exposed platinum provides the active catalytic surface area. The remainder of the platinum which is embedded in the teflon, provides no catalytic activity. In contrast, the present invention allows maximum catalytic surface area by eliminating teflon related catalyst loss.

The platinum atoms 58 thus catalyze the oxidation reaction, separating hydrogen molecules 40 into hydrogen ions 62 and electrons 61. The electrons 61 flow away from electrolyte matrix 4 and toward conductor 7 while hydrogen ions 62 diffuse through electrolyte matrix 4. The hydrogen ions 62 eventually move to surface 20 of cathode 8 where they combine with oxygen molecules 66 and returning electrons 61 to create water molecules 70 by a reduction reaction. The water molecules produced may be utilized to premoisten a solid electrolyte to prevent performance degradation. This is accomplished by a combination of gas pressure from the fuel and oxidant and the porous carbon preventing escape of the larger water molecules.

The preferred method of fabricating electrodes 6 and 8 is as follows. A thin graphite sheet is fabricated by doctor blading. This process is desirable because it intrinsically leaves a degree of porosity in the final product as plasticizers and binders are burned off, making such material suitable for the substrate layer 30. The carbon graphite sheet in the preferred method has a thickness of 0.254 mm and is 99.9% pure with a surface roughness of approximately 2–3 microns root mean square (rms).

Gas channels, perpendicular to the plane of the electrode, are formed by the use of a tapered metal pin. The tapered metal pin is placed in a drill press to control the depth of penetration. The gas channels are subsurface channels which will serve to facilitate gas flow to the catalyst layer of the electrode.

The graphite sheet is susceptible to absorbing water vapor from air. Therefore, the sheet is baked before the fullerene coating procedure. The material is a fairly robust, flexible sheet and does not appear to crumble or delaminate readily.

The graphite sheet is cut into the proper electrode shape. Once the sheet has been cut into the electrode shapes, the electrode shaped sheets are placed in a clean curing oven at 220 to 230 degrees Celsius to drive off any volatile substances such as water or organic solvents. After clean oven curing, the graphite sheet is inserted in a holder to support the electrode during the fullerene and platinum deposition process.

The individual holders and attendant electrodes are then installed in a vaporation system. Fullerenes are placed in a quartz thimble and lowered into a tungsten coil. The coil is energized to 3.5 volts and becomes red hot. The fullerenes are sublimed and deposited upon the electrode. The electrode is centered above the quartz crucible at 7.5 inches during the vaporation process which allows for deposition of a fairly uniform film of fullerenes. The system pressure for this step is $10^{-5}$ Torr. The film is deposited at 13–20 angstroms per second to a final target film thickness of 200 angstroms.

Immediately after the deposition of the fullerene layer, the electrode and holder are transferred to an electron beam evaporation system. A target layer of 467 angstroms of platinum atoms is deposited by electron beam evaporation. The electrode is positioned about 24 inches above the platinum source and subjected to a deposition rate of 2 angstroms per second. The system pressure is $2\times10^{-6}$ Torr. Other means may be employed to deposit the platinum. For example, platinum may be deposited by means of evaporation from outgassed SAES getter sources, by sputtering, by vaporization or by electroplating, as are used in semi-conductor fabrication processes. The electrode is then stored in a desiccator afterwards for future processing.

When a solid polymer electrolyte is used, as in the present embodiment, the electrolyte can be hot-pressed to the surface of each electrode. The electrolyte is hot-pressed to each electrode at a temperature of approximately 130 degrees celsius and at a pressure of 50-60 atmospheres for one minute. The result is a unitized electrode/electrolyte/electrode assembly less than one millimeter in width.

Figure 4:
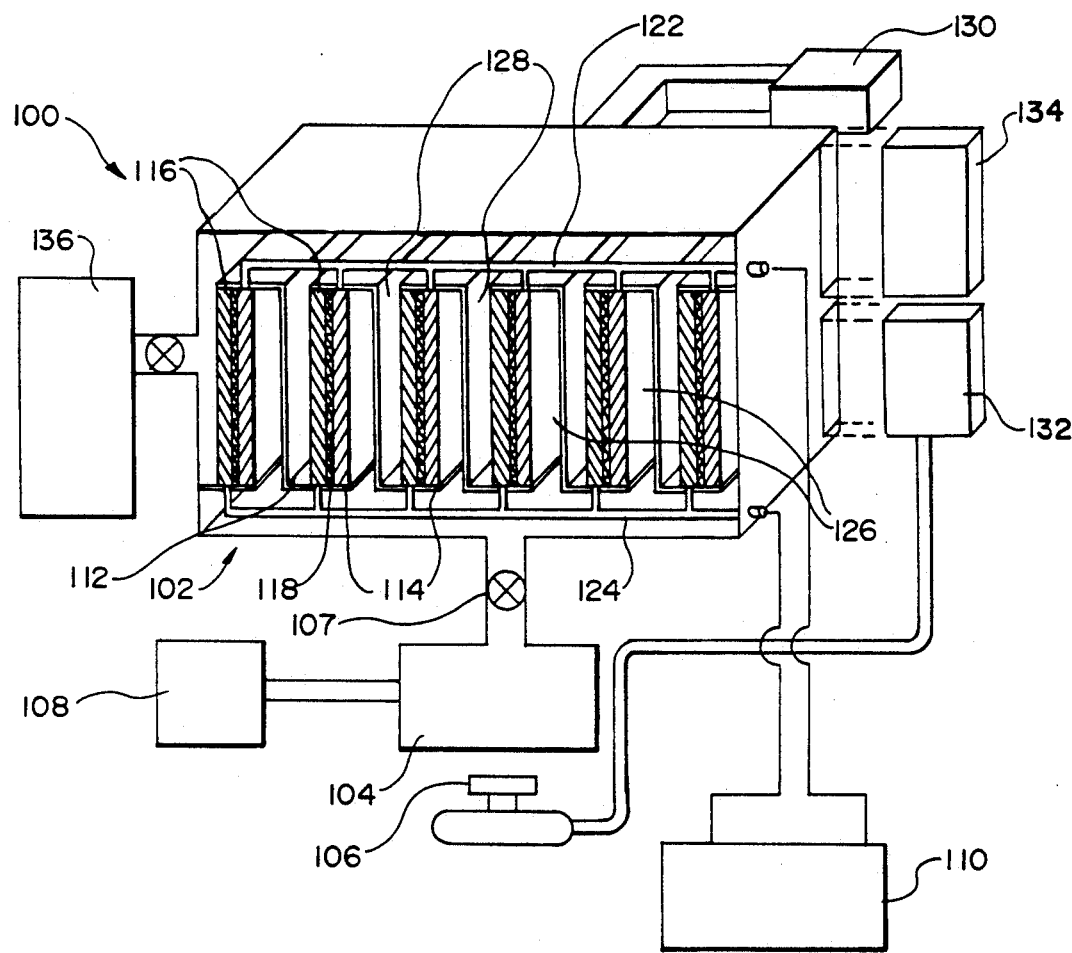
FIG. 4 represents a large scale application of fuel cells with electrodes of the present invention.

A large scale application of the present invention is shown in FIG. 4 which shows a multi-chamber fuel cell system. The fuel cell system 100 is composed of energy generation unit 102, fuel processor 104, burner 106 and fuel tank 108. The energy generation unit 102 is made up of numerous fuel cells 112. Each fuel cell 112 is composed of a first electrode 114 of the present invention which is in contact with the fuel, a second electrode 116 of the present invention which is in contact with the oxidant, and a solid electrolyte layer 11 which is sandwiched between the first and second electrodes 114 and 116. All of the first electrodes 114 are connected to first electrical contact 122 which is one of the contacts of the fuel cell and may be connected to an electrical load 110 which may be any device requiring power such as an appliance. All of the second electrodes 116 are connected to second electrical contact 124 which is the second electrical contact to electrical load 110.

Fuel tank 108 is connected to fuel processor 104. Fuel tank 108 contains liquid or gaseous hydrocarbon fuel such as methanol, ethanol or methane. The only requirement is that the fuel processor 104 be able to reform the fuel to $H_2$ and $CO_2$ or small amounts of CO. The fuel is reduced in fuel processor 104 by burner 106 and hydrogen gas flows through control value 107 to fuel chambers 126 which contact fuel cells 112 by their first electrodes 114.

The oxidant for energy generation system 102 is ordinary air which is vented into air intake chambers 128. The air intake chambers 128 are in physical contact with fuel cells 112 by the second electrodes 124. Thus electricity is produced by the potential difference between the oxidant and hydrogen gas as described above. Excess air is vented out to air exit chamber 130.

Byproducts such as hydrogen gas and carbon dioxide are vented out to reformed gas chamber 132 which is used to fuel burner 106 once the fuel cells have begun operation. Fuel processor 104 may be heated by excess heat from other energy generation sources for a co-generation scheme utilizing fuel cell system 100. Likewise, the steam byproduct from the oxidation and reduction reactions occurring in fuel cells 112 is vented to steam chamber 134 which may be utilized to create pressure to drive air intake 136. The steam may be utilized for other purposes as well.

The improved fuel cell electrode 6, 8 of the present invention serves to greatly reduce the amount of platinum required in electrode construction while maintaining the same level of fuel cell voltage output. Previous fuel cells had required 50 grams of platinum to produce a kilowatt of electricity, the present invention only requires approximately 2 grams of platinum to achieve the same output. Thus, the use of the irregular platinum layer results in significantly less platinum for each fuel cell and accordingly significantly less cost.

Furthermore, the platinum catalyst is utilized more efficiently by the greater surface area contact available for the oxidation reaction, which is determinative of electrical output. The increased exposure to the platinum catalyst thereby increases the rate of electron production from the oxidation reaction.

Moreover, the ability of the fullerene structure to securely anchor the platinum atoms prevents platinum atom migration. The $Pt/C_{60}$ anchor layer firmly holds the platinum atoms which in turn bond with the catalyzing platinum lattice structures. Thus, the improved fuel cell electrode may be reused virtually continuously.

The absence of dangling bonds from surface carbon atoms on the fullerene molecules prevents the oxidation of carbon atoms in the electrode or electrolyte matrix, further preventing the degradation of electrolyte performance.

The use of $C_{60}$ fullerene molecules to bind heterogenous materials such as graphite and platinum, allows maximum exposure of the platinum surfaces to the electrolyte and eliminates teflon-related loss associated with prior fuel cell electrodes.

The use of subsurface, tapered gas channels allows diffusion of the reactant gases to the catalytic surface area but minimizes the amount of electrolyte material which may weep into the electrode itself. Slightly positive gas pressures in the fuel and oxidant chambers serve to prevent electrolyte flooding.

The aforementioned description is not to be interpreted to exclude other fuel cell arrangements advantageously employing the present invention. For example, a basic electrolyte using hydroxyl ions in a basic solution electrolyte may be utilized with equal or better effectiveness. Catalysts other than platinum and porous substrate layers comprising material other than graphite carbon may also be used. Furthermore, it is to be understood that the above described fuel cell electrode is merely an illustrative embodiment of the principles of this invention and that numerous other arrangements and advantages may be devised by those skilled in the art without departing from the spirit and scope of the invention.

What is claimed is:

1. A method for producing an improved electrode for use in a fuel cell having a chamber for fuel, a chamber for an oxidant, an electrolyte layer disposed between the fuel chamber and the oxidant chamber, and two electrodes, the first electrode in contact with the fuel and the electrolyte layer and the second electrode in contact with the oxidant and the electrolyte layer, the first and second electrodes having a plurality of adjacent, substantially planar layers, the process comprising the steps of:

providing a substrate layer having a first and second surface, the first surface of the substrate layer being exposed to the fuel or oxidant;

forming a $C_{60}$ fullerene molecule layer, having a first and second surface, on the second surface of the substrate layer;

implanting platinum atoms onto the second surface of the $C_{60}$ fullerene molecule layer, thereby forming a platinum layer in contact with the electrolyte layer.

2. The process in accordance with claim 1 where the step of forming a $C_{60}$ fullerene molecule layer, having a first and second surface, on the second surface of the substrate layer further comprises:

placing carbon $C_{60}$ fullerene molecules in a quartz crucible;

lowering the quartz crucible into a tungsten coil; and energizing the tungsten coil to sublime the $C_{60}$ fullerene molecules to the second surface of the substrate layer.

3. The process in accordance with claim 1 in which platinum atoms are deposited on the $C_{60}$ fullerene molecule layer by means of electroplating.

4. The process in accordance with claim 1 in which platinum atoms are deposited on the $C_{60}$ fullerene molecule layer by means of electron beam evaporation.

5. The process in accordance with claim 1 in which platinum atoms are deposited on the $C_{60}$ fullerene molecule layer by means of sputtering.

6. The process in accordance with claim 1 in which platinum atoms are deposited on the $C_{60}$ fullerene molecule layer by means of vaporization.

7. The process in accordance with claim 1 in which the step of providing a substrate layer having a first and second surface further comprises perforating the first surface of the substrate layer with tapered channels sufficient to allow communication of the oxidant through the substrate layer to the platinum layer.

8. The process in accordance with claim 1 in which the step of providing a substrate layer having a first and second surface further comprises perforating the first surface of the substrate layer with tapered channels sufficient to allow communication of the fuel through the substrate layer to the platinum layer.

* * * * *